United States Patent [19]
Phillips

[11] 3,973,140
[45] Aug. 3, 1976

[54] CONTROL CIRCUITS FOR VEHICLE REAR WINDOW HEATERS

[75] Inventor: Edward Graham Phillips, Colne, England

[73] Assignee: The Lucas Electrical Company Limited, Birmingham, England

[22] Filed: Jan. 27, 1975

[21] Appl. No.: 544,628

[30] Foreign Application Priority Data
Jan. 29, 1974 United Kingdom............... 3984/74

[52] U.S. Cl.............................. 307/247 A; 219/203; 219/492; 219/501; 307/293; 307/246; 317/141 S; 340/234
[51] Int. Cl.² .................. H03K 17/26; H05B 1/02; B60L 1/02
[58] Field of Search................... 219/203, 492, 501; 317/141 S; 340/234; 307/293, 246, 247 A, 247 R

[56] References Cited
UNITED STATES PATENTS

| | | | |
|---|---|---|---|
| 3,287,608 | 11/1966 | Pokrant | 307/293 |
| 3,809,927 | 5/1974 | Takagi | 317/141 S |
| 3,858,027 | 12/1974 | Phillips | 219/203 |
| 3,898,423 | 8/1975 | Taylor et al. | 219/203 |

Primary Examiner—Stanley D. Miller, Jr.

[57] ABSTRACT

A vehicle rear window heater control comprises a touch switch, a bistable circuit driven between its two states by the touch switch, a relay operated by the bistable circuit so that the heater is controlled by the touch switch and a monostable circuit triggered by the relay for switching off the bistable a predetermined time after the touch switch has been actuated to energize the heater.

3 Claims, 1 Drawing Figure

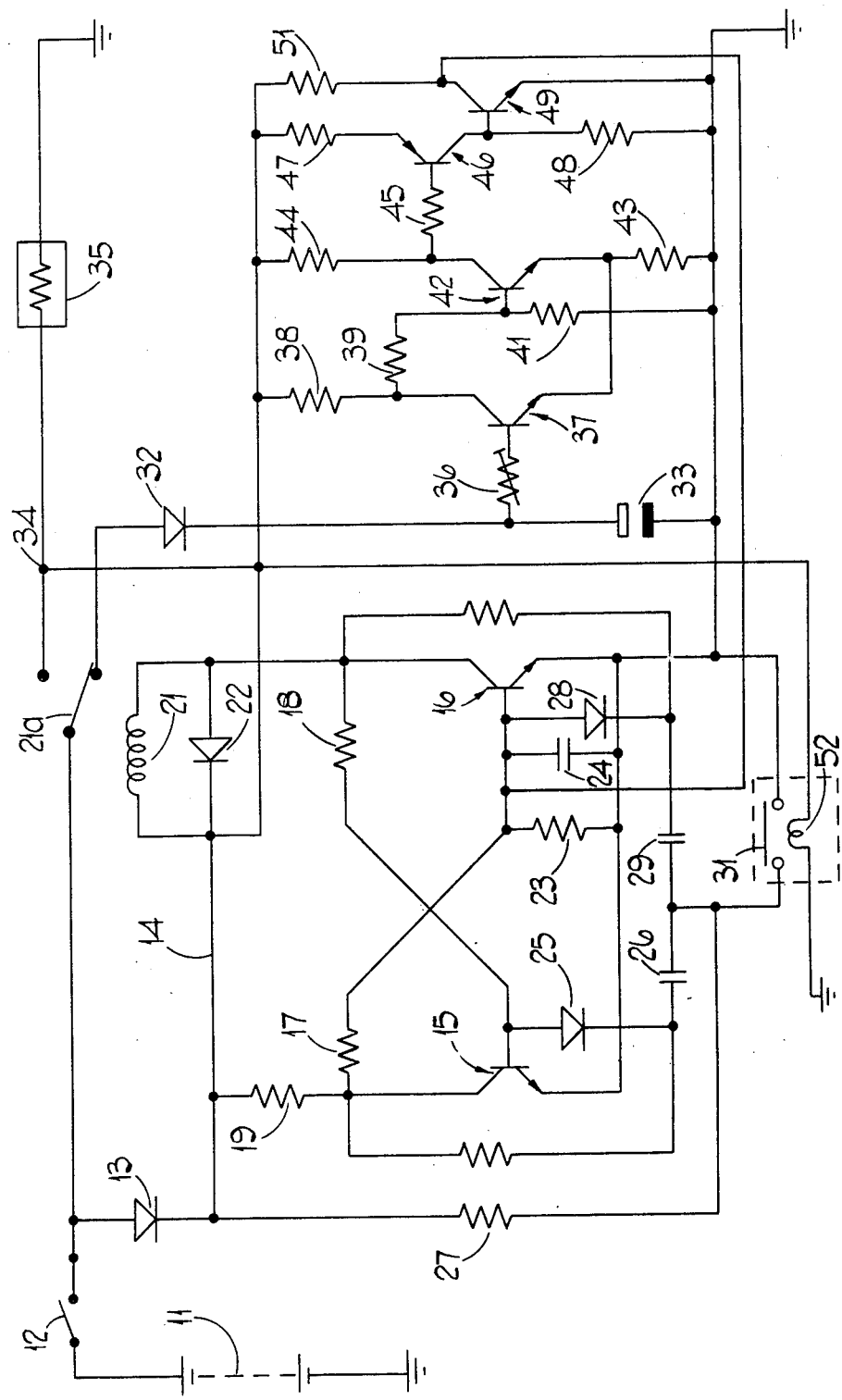

CONTROL CIRCUITS FOR VEHICLE REAR WINDOW HEATERS

This invention relates to control circuits for vehicle rear window heaters.

A control circuit according to the invention comprises in combination a bistable circuit having first and second states, the bistable circuit is biased so as initially to occupy a first state when it is connected to a supply, switch means operable by the bistable circuit and occupying first and second positions when the bistable circuit is in its first and second states respectively, an output terminal for connection to the heater, the switch means providing power to the output terminal when it is moved to its second position, a normally open switch associated with the bistable circuit and serving each time it is operated to change the state of the bistable circuit, and a monostable circuit coupled to the switch means and being held in its unstable state when the switch means is in its first position, the monostable circuit being coupled to the bistable circuit and reversion of the monostable circuit to its stable state driving the bistable circuit to its first state.

The accompanying drawing is a circuit diagram illustrating one example of the invention.

Referring to the drawing, a vehicle battery 11 has its negative terminal earthed and its positive terminal connected through the vehicle ignition switch 12 and a diode 13 in series to a supply line 14. Connected between the line 14 and earth is a bistable circuit comprising a pair of n-p-n transistors 15, 16 having their emitters earthed, the collectors of the transistors 15 and 16 being connected to the bases of the transistors 16 and 15 respectively through resistors 17, 18, the transistor 15 having its collector connected to the line 14 through a resistor 19 and the transistor 16 having its collector connected to the line 14 through a relay winding 21 bridged by a freewheel diode 22. The base of the transistor 16 is connected to earth through a resistor 23 and a capacitor 24 in parallel, so that when the ignition switch 12 is first closed the bistable circuit assumes a condition with the transistor 15 on and the transistor 16 off.

The base of the transistor 15 is connected through a diode 25 and a capacitor 26 in series to one end of the resistor 27 the other end of which is connected to the line 14. The base of the transistor 16 is similarly connected through a diode 28 and a capacitor 29 in series to one end of the resistor 27, and the junction of the capacitors 26, 29 is connected to earth through a normally open manually operable switch 31. The relay winding 21 serves to control a relay contact 21a which normally occupies the position shown in which it completes a circuit from the battery 11 through the switch 12, the contact 21a, a diode 32 and a capacitor 33 to earth. In its alternative position, which it occupies when the relay winding is energised, the contact 21a completes a circuit through the switch 12 to an output terminal 34. In use, a rear window heater 35 is connected between the terminal 34 and earth.

The junction of the diode 32 and capacitor 33 is connected through a resistor 36 to the base of an n-p-n transistor 37 the collector of which is connected to the line 14 through a resistor 38 and is also connected through resistors 39, 41 in series to earth, the junction of the resistors 39, 41 being connected to the base of an n-p-n transistor 42. The emitters of the transistors 37, 42 are connected through a resistor 43 to earth, and the collector of the transistor 42 is connected to the line 14 through a resistor 44, and is further connected through a resistor 45 to the base of a p-n-p transistor 46 having its emitter connected through a resistor 47 to the line 14 and its collector connected through a resistor 48 to earth. The collector of the transistor 46 is also connected to the base of an n-p-n transistor 49, the emitter of which is earthed and the collector of which is connected through a resistor 51 to the line 14, and is further connected to the base of the transistor 16. Finally, the terminal 34 is connected to earth through a warning lamp 52 which is associated with the switch 31, mounted on the dashboard of the road vehicle.

When the ignition switch 12 is first closed, the bistable circuit constituted by the transistors 15, 16 and their associated components occupies its first state with the transistor 15 on and the transistor 16 off, so that the relay winding 21 is not energised. Current flows through the contact 21a to charge the capacitor 33 and hold the transistor 37 on, so that the transistors 42, 46 and 49 are all off. The transistors 37, 42, 46 and 49 and their associated components including the capacitor 33, constitute a monostable circuit which is held in its unstable condition by the contact 21a.

When it is desired to operate the rear window heater 35, the switch 31 is closed momentarily, so earthing the base of transistor 15 through the diode 25 and capacitor 26. The bistable circuit now switches to its alternative stable state with the transistor 16 conductive, and the relay winding 21 is energised to move the contact 21a to its alternative position and complete the circuit to the heater 35. At the same time, the base of the transistor 37 is decoupled from the battery 11, but the monostable circuit stays in its unstable condition while the capacitor 33 discharges. Typically, this can take 10 minutes. At the end of the 10 minute period, the transistor 37 turns off and the transistors 42, 46 and 49 turn on. The base of the transistor 16 is now connected by way of the transistor 49 to earth, and so the transistor 16 turns off and the transistor 15 turns on again, de-energising the winding 21 so that the heater is no longer operated.

If at any time during the 10 minute period the switch 31 is touched again, then the base of the transistor 16 is earthed by way of the diode 28 and the capacitor 29 and the transistor 15 conducts again, so turning off the heater 35. The capacitor 33 is then re-charged, so that a further operation of the switch 31 turns the heater on again, and commences another timing cycle.

I claim:

1. A control circuit for a vehicle rear window heater comprising, in combination: a bistable circuit having first and second states, having means for connection to a supply, and being biased so as to occupy a first state when connected to the supply by said means, switch means operably connected to said bistable circuit and occupying first and second positions when said bistable circuit is in its first and second states, respectively, an output terminal operatively connected to said switch means and for connection to the heater, said switch means providing power to said output terminal when moved to its second position, a normally open switch connected to said bistable circuit for changing the state of the bistable circuit each time it is operated, and a monostable circuit coupled to said switch means so as to be held in its unstable state when said switch means is in its first position, said monostable circuit being coupled to said bistable circuit, so as to switch said bistable circuit to its first state upon reversion of the monostable circuit to its stable state.

2. A control circuit as claimed in claim 1 in which said switch means is a relay having a changeover contact connecting the supply to the heater in one position and to the monostable circuit in the other position.

3. A control circuit according to claim 1, comprising an input transistor, said switch means in its first position connecting the base of said input transistor to said supply to drive the monostable circuit into its unstable state, a circuit connected to the base of said input transistor and including a capacitor connecting the base to ground, whereby the discharge of said capacitor through said base circuit controls the reversion of said monostable circuit.

* * * * *